(12) United States Patent
Cho

(10) Patent No.: US 6,172,524 B1
(45) Date of Patent: Jan. 9, 2001

(54) DATA INPUT BUFFER

(75) Inventor: Kyu Seok Cho, Kyungki-Do (KR)

(73) Assignee: Hyundai Electronics Industries Co., Ltd., Kyungki-Do (KR)

( * ) Notice: Under 35 U.S.C. 154(b), the term of this patent shall be extended for 0 days.

(21) Appl. No.: 09/342,220

(22) Filed: Jun. 29, 1999

(30) Foreign Application Priority Data

Jun. 29, 1998 (KR) ................................................ 98-24866

(51) Int. Cl.[7] ................... H03K 19/0944; H03K 19/017
(52) U.S. Cl. ............................... 326/70; 326/62; 326/63; 326/80; 326/81; 327/100
(58) Field of Search .............................. 326/62, 63, 70, 326/80, 81; 327/100

(56) References Cited

U.S. PATENT DOCUMENTS

| | | | |
|---|---|---|---|
| 5,300,835 | * | 4/1994 | Assar et al. .......................... 307/475 |
| 5,530,379 | * | 6/1996 | Konishi et al. ........................ 326/68 |
| 5,581,209 | * | 12/1996 | McClure .............................. 327/538 |
| 5,589,794 | * | 12/1996 | McClure .............................. 327/538 |
| 5,594,373 | * | 1/1997 | McClure .............................. 327/108 |
| 5,696,456 | * | 12/1997 | Lee ..................................... 326/70 |
| 5,959,927 | * | 9/1999 | Yamagata et al. .................... 365/229 |
| 5,977,807 | * | 11/1999 | Watanabe ............................ 327/175 |
| 5,990,708 | * | 11/1999 | Hu ....................................... 327/68 |
| 6,023,174 | * | 2/2000 | Kirsch .................................. 326/34 |
| 6,023,181 | * | 2/2000 | Penny et al. ......................... 327/291 |

* cited by examiner

*Primary Examiner*—Viet Q. Nguyen
(74) *Attorney, Agent, or Firm*—Pennie & Edmonds LLP

(57) ABSTRACT

There is disclosed a data input buffer for buffering external input signals into signals suitable for internal signals in a semiconductor memory device. The data input buffer includes switching means controlled by first and second determination signals; and a buffering circuit which is operated as a SSTL buffer or a LVTTL buffer according to the operation of the switching means.

10 Claims, 4 Drawing Sheets

DATA INPUT BUFFER

BACKGROUND OF THE INVENTION

1. Field of the Invention

The invention relates generally to a data input buffer for buffering external input signals into signals suitable for internal signals in a semiconductor memory device, and more particularly to a data input buffer by which external input signals with two different standards are converted into a CMOS signal by means of a single circuit.

2. Description of the Prior Art

Generally, the data input buffer is commonly classified into two types: a CMOS invertor type and a differential amplifier type having a current mirror structure.

Referring to FIG. 1, there is shown a circuit diagram for illustrating a first embodiment of a conventional data input buffer. The circuit includes a CMOS invertor for converting an externally input signal of a Low Voltage Transistor-Transistor Logic (hereinafter called LVTTL) standard into an internal CMOS signal, which is consisted of P and N channel MOS transistors MP11 and MN11 connected serially between the external supply power and the ground.

The operation of the data input buffer having the above construction will be now explained below.

In case that the difference between the potential of the externally input signal Vin and the external supply power Vext is lower than the threshold voltage Vt of the P channel MOS transistor MP11, the P channel MOS transistor MP11 will be at a saturation region, while the N channel MOS transistor MN11 will be at a cut-off region. Thus, the external supply power Vext is transferred to an output terminal VOUT through the P channel MOS transistor MP11 which is turned on, and thus the output terminal Vout maintains a high level.

However, in case that the difference between the potential of the input signal Vin and the ground voltage Vss is higher than the threshold voltage Vt of the N channel MOS transistor MN11, the N channel MOS transistor MN11 will be at a saturation region, while the P channel MOS transistor MP11 will be at a cut-off region. Thus, the output terminal VOUT will be grounded through the N channel MOS transistor MN11 which is turned on, and thus the output terminal Vout maintains a low level.

In other words, if the input signal Vin is High, the output terminal Vout becomes Low and if the input signal Vin is Low, the output terminal Vout becomes High. At this time, the input potential at which the potential of the output terminal Vout changes from Low to High or from High to Low, becomes a trip point of the invertor. In order to increase immunity against the noise of the input signal, the W/L ratio of the P, N channel MOS transistors MP1 and MN11 are adjusted to have the trip point positioned at the middle between the minimum value of the high potential Vih and the maximum value of the low potential Vil, which are the LVTTL signal standards.

However, in case of Stub Series Terminated Logic (hereinafter called SSTL) which emerges as a new high-speed signal connection standard, it additionally requires a reference voltage Vref for deciding a High level or a Low level of the signal. In addition, as the variation width of High or Low signals from the reference voltage Vref is not so large, when the invertor-type input buffer shown in FIG. 1 is used, both the P, N channel MOS transistors MP11, MN11 will exist at an ohmic region. Thus, the inverter-type input buffer has disadvantages that it increases unnecessarily a power consumption and also decreases the degree of signal determination.

Referring now to FIG. 2, there is shown a circuit diagram for illustrating a second embodiment of a conventional data input buffer, which particularly shows a construction of a differential amplifier circuit having a current mirror structure which is suitable for the SSTL signal standard.

The data input buffer shown in FIG. 2 includes two N channel MOS transistors MN21, MN22, with a gate of the MOS transistor MN21 being applied with an input signal Vin and a gate of the MOS transistor MN22 being applied with a reference voltage Vref; two P channel MOS transistors MP21, MP22 respectively connected between the drains of the two N channel MOS transistors MN21, MN22 and the external supply power Vext, each gate of which is commonly connected to the drain of the N channel MOS transistor MN21; and an N channel MOS transistor MN23 connected between the common source connection node of the two N channel MOS transistors MN21, MN22 and the ground Vss, for controlling the operation of the entire circuit using an externally applied bias potential.

The principle of the operation will be below explained in detail by reference to FIG. 2. If the potential of the input signal Vin is higher than the reference voltage Vref, the potential difference between the gate-source of the N channel MOS transistor MN21 to which the input signal Vin is applied, becomes higher than that between the gate-source of the N channel MOS transistor MN22 to which the reference voltage Vref is applied. Thus, a bias voltage Vbias is applied to the N channel MOS transistor MN23 the channel length of which is longer than that of the N channel MOS transistors MN21, MN22, thereby making a constant amount of current flow through the transistor MN23. As a result, the current supply power of the transistor MN21 becomes larger than that of the transistor MN22.

Accordingly, the drain voltage of the transistor MN21 becomes lower than that of the transistor MN22, and the effective resistance value of the transistors MP21, MP22 is accordingly varied. As the potential difference between the gate-source of the transistor MP21 connected between the transistor MN21 and the external supply power Vext becomes further great to increase its effective resistance value, an external high supply power Vext is transmitted to the output Vout via the transistor MP22 the effective resistance value of which is small relatively. Thus, a High signal is outputted via the output Vout.

On the contrary, if the potential of the input signal Vin is lower than the reference voltage Vref, the transistor MN22 will be more rapidly turned on, this making the potential of the output Vout flow into the ground Vss. Thus, a Low signal will be outputted via the output Vout.

As a result, the differential amplifier circuit as described above has disadvantages that it makes a constant level of current flow on it, and it must generate internally a bias voltage Vbias to drive the circuit for controlling the signal determination potential Vref and the current flow at a saturation region.

Conventionally, in order to satisfy the LVTTL and SSTL signal standards, a method of selectively on/off the CMOS inverter circuit shown in FIG. 1 and the differential amplifier circuit shown in FIG., 2 is used. However, even in this case, it has a problem that it is difficult to prevent current from being consumed because a path of an unnecessary current generated from the differential amplifier is established, and that an unselected circuit consumes power because only a selected circuit is used. Also, there is a problem in that chip size increases.

SUMMARY OF THE INVENTION

It is therefore an object of the present invention to provide a data input buffer in which a buffering circuit suitable for two different externally input signal standards is formed as a single circuit, even without a static flow of current and generation of an internal bias voltage, so that the two different externally input signals can be converted into CMOS signals being the internal signal standard.

To accomplish the above object, the data input buffer comprises a first switching circuit connected between an external supply power and a node and controlled by a first determination signal, a second switching circuit connected between the node and a ground terminal and controlled by a second determination signal, and a buffering circuit operated as a SSTL buffer or a LVTTL buffer according to operations of the first and second switching circuits.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
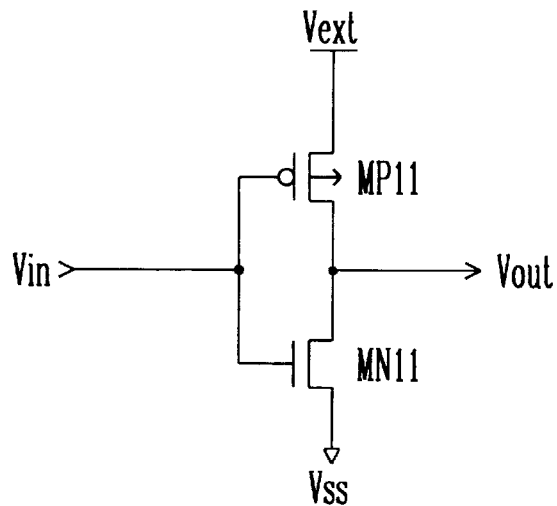
FIG. 1 is a circuit diagram for showing a first embodiment of a conventional data input buffer.
Figure 2:
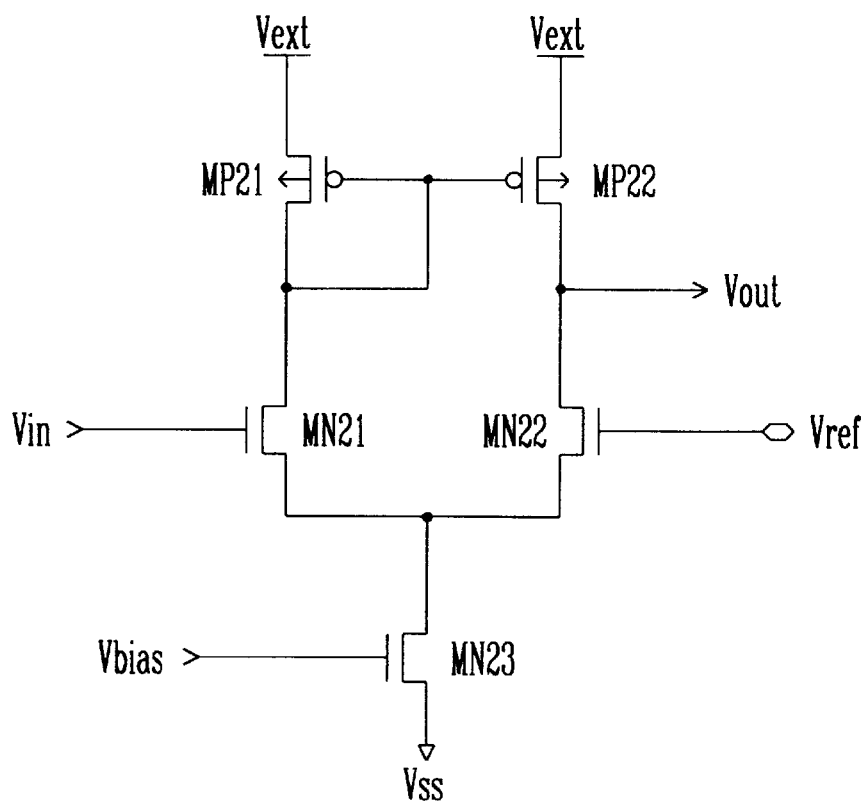
FIG. 2 is a circuit diagram for showing a second embodiment of a conventional data input buffer.

The present invention will be described in detail by way of a preferred embodiment with reference to accompanying drawings, in which like reference numerals are used to identify the same or similar parts.

Figure 3:
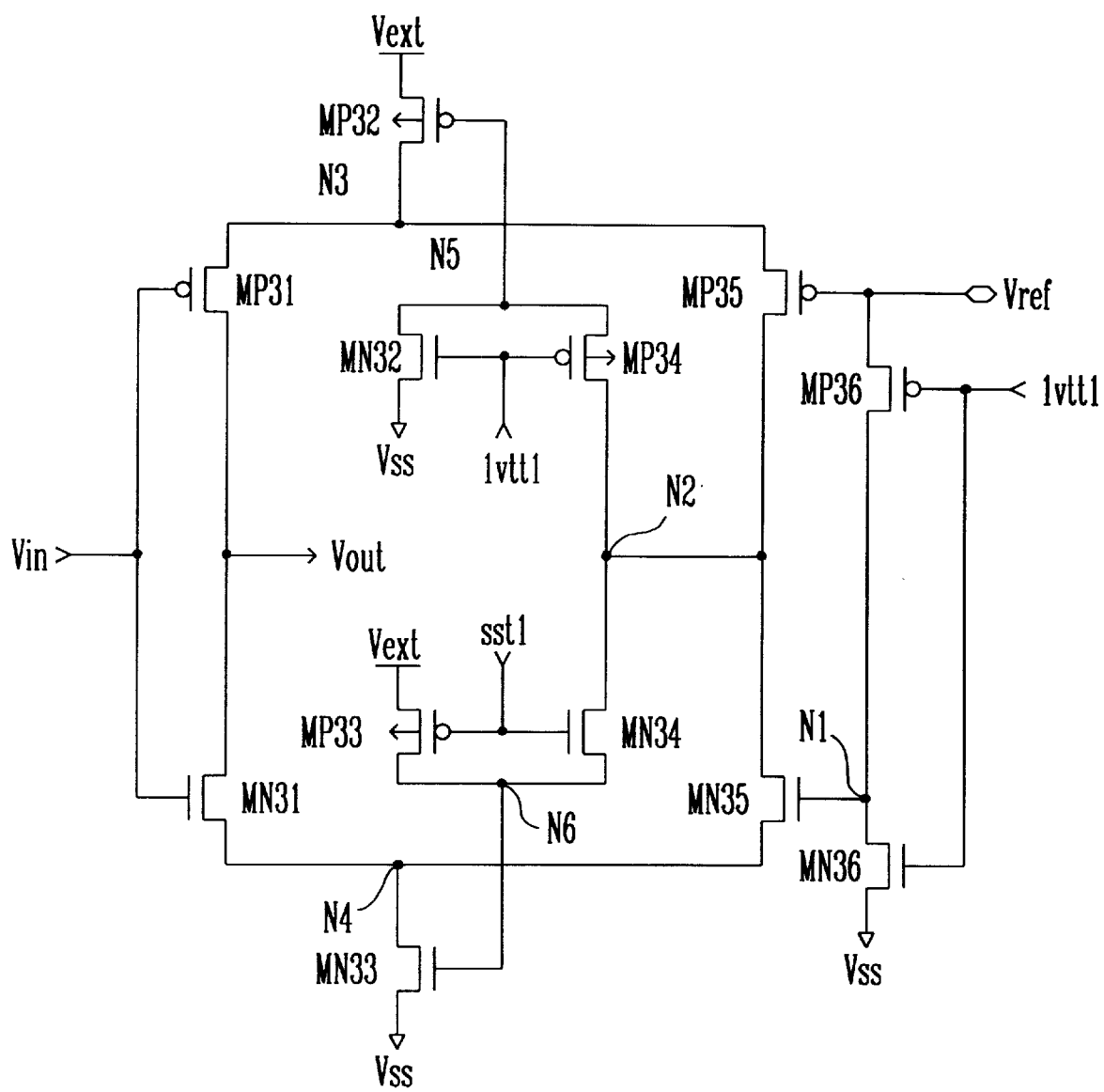
FIG. 3 is a circuit diagram of a data input buffer according to the present invention.

FIG. 3 is a circuit diagram of the data input buffer according to the present invention. The data input buffer shown in FIG. 3 includes P, N channel MOS transistors MP31, MN32 to each gate of which is applied an input signal Vin and, connected serially from each other through an output node Vout; each combination of N, P channel MOS transistors MN32/MP34, MP33/MN34 each drain of which is commonly connected by nodes N5, N6 and each gate of which is commonly controlled by the LVTTL and SSTL standard determination signals lvtt1, sst1; P, N channel MOS transistors MP35 which are connected to the P, N channel MOS transistors MP34, MN34 by the connection node N2; P, N channel MOS transistors MP36, MN36 which is connected between the reference voltage Vref connected to the gate of the P channel MOS transistor MP35 and the ground, by the node N1 connected to the gate of the N channel MOS transistor MN35, each gate of which is applied the LVTTL standard determination signal Lvtt1; a P channel MOS transistor MP32 the gate of which is connected to the node N5, connected between the external supply power Vext and the common drain connection node N3 of the two P channel MOS transistors MP31, MN31; and an N channel MOS transistor MN33 the gate of which is connected to the node N6, connected between the common source connection node N4 of the two N channel MOS transistors MN31, MN35 and the ground Vss.

Then, the sources of the N, P channel MOS transistors MN32, MP33 are connected to the ground Vss and the external supply power Vext, respectively.

Figure 4:
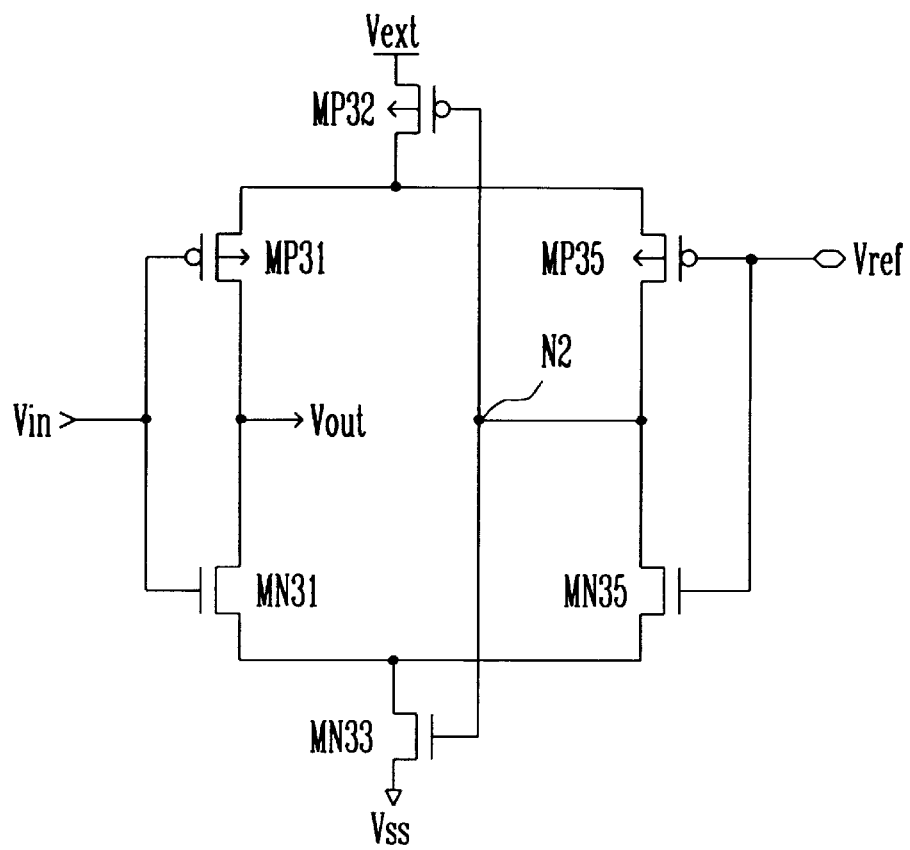
FIG. 4 is a first equivalent circuit diagram of the data input buffer shown in FIG. 3.
Figure 5:
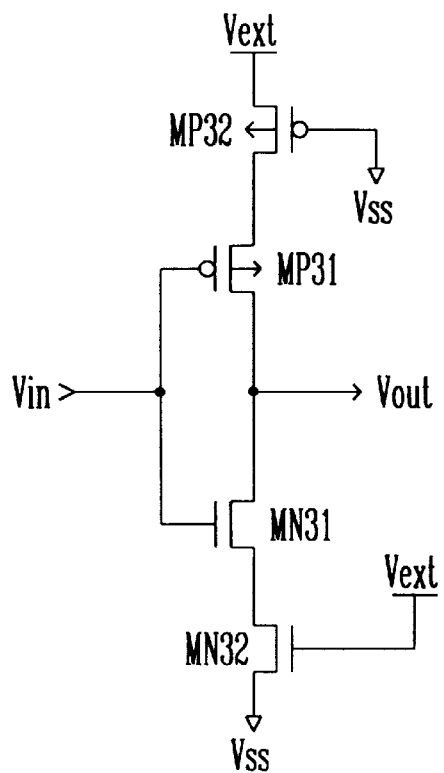
FIG. 5 is a second equivalent circuit diagram of the data input buffer shown in FIG. 3.
Figure 6:
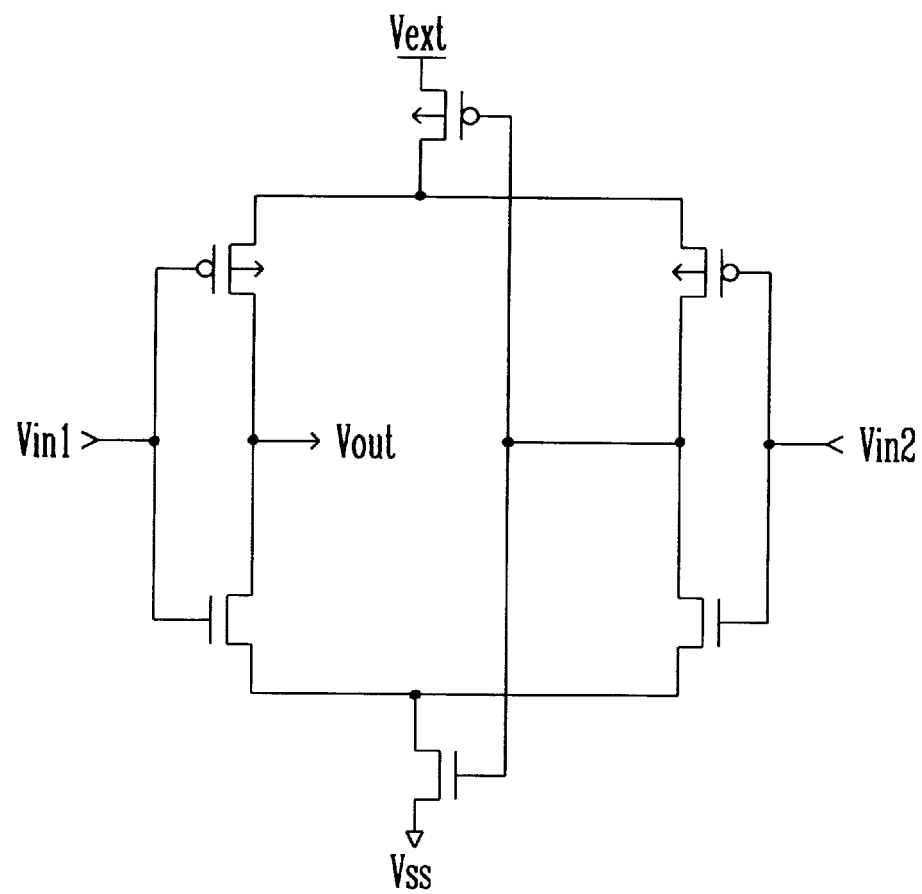
FIG. 6 is a third equivalent circuit diagram of the data input buffer shown in FIG. 3.

FIGS. 4 to 6 show first through third equivalent circuit diagrams of the data input buffer having the above-described construction. The operation of the data input buffer according to the present invention will be explained in detail below.

The operations are mainly classified into two execution modes. First, in the SSTL standard, the first determination signal sstl becomes a logic High. The transistor MN34 is turned on and the transistor MP33 is turned off, thus connecting the node N2 to the gate of the transistor MN33. Then, as a logic Low signal is applied as the second determination signal lvtt1 which is an inverted signal of the first determination signal sstl, the transistor MN32 is turned off and the transistor MP34 is turned on, thus transmitting the potential of the node N2 to the gate of the transistor MP32. Also, the transistor MP36 the gate of which is applied the second determination signal lvvt1 being the logic Low potential level is turned on, and the transistor MN36 is turned off, thus connecting the reference voltage Vref to the gate of the transistors MP35 and MN35.

The equivalent circuit of the execution mode is shown in FIG. 4, which is serving as a differential amplifier for comparing the two input signals Vin, Vref to amplify the difference thereof. At this time, the bias voltage of the differential amplifier having the circuit construction shown in FIG. 4, which is applied via the node N2 connected to the gate of the transistor MN43, has an opposite phase to the output voltage Vout and changes dynamically, thus appropriately shutting off the flow of current and thus reducing power consumption.

Then, there is another execution mode in which a signal is input as the LVTTL standard, which controls the operation of the circuit, in such a way that logic High and logic Low potentials are applied to the second and first determination signals lvtt1, sst1, respectively. In this case, the equivalent circuit is like as the invertor circuit shown in FIG. 5, in which if the potential of the input signal Vin is higher than the trip point of the inverter, a logic Low signal will be outputted via the output Vout, and on the contrary, if the potential of the input signal Vin is lower than the trip point of the inverter, a logic High signal will be outputted.

As mentioned above, the data input buffer according to the present invention efficiently converts externally input signals with two different signal standards into a CMOS signal being an efficient internal signal standard using a single circuit.

In addition, though the LVTTL and SSTL are used as two different signal standards in the preferred embodiment of the present invention, the present invention may be as well applied to CMOS or LVCMOS (Low Voltage Complementary Metal Oxide Semiconductor) circuit, which has to satisfy both the signal standard which does not require a reference voltage for determinating the potential of the signal such as LVTTL, TTL (Transistor-Transistor Logic) standard etc., and the signal standard which compares the potential of the externally input signal with the reference voltage to determine the potential of the signal using the potential difference such as SSTL, CTT(Centre Tapped Termination), HSTL(High Speed Transceiver Logic) standard etc.

In addition, instead of the differential amplifier shown in FIG. 4, the equivalent circuit shown in FIG. 6, is obtained by removing the second and first determination signals lvtt1, sst1 from FIG. 4. The equivalent circuit of FIG. 6 is constructed to vary dynamically the internal bias voltage depending on the output voltage, using the output voltage as an internal bias voltage.

As mentioned above, the data input buffer according to the present invention can provide an outstanding effect that it can efficiently convert the signals input as LVTTL and SSTL standards into a CMOS level signal being an internal signal standard simultaneously using a single circuit.

Thus, an outstanding effect that can reduce the device area can be obtained since it can control the signals input as two signal standards using a single circuit, instead of the inverter and the differential amplifier which are required to satisfy the two signal standards in the prior art.

Also, the present invention provides an outstanding effect that it can greatly reduce the power consumption by, using the bias voltage which dynamically varies, shutting off the static current path occurred in the differential amplifier used for buffering the SSTL standard signal.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A data input buffer, comprising:
   a first switching circuit connected between an external supply power and a node and controlled by a first determination signal;
   a second switching circuit connected between said node and a ground terminal and controlled by a second determination signal; and
   a buffering circuit operated as a SSTL buffer or a LVTTL buffer according to operations of said first and second switching circuits.

2. A data input buffer comprising:
   a switching circuit controlled by first and second determination signals; and
   a buffering circuit selectively operated as a SSTL buffer or a LVTTL buffer in accordance with operation of said switching circuit, wherein said SSTL buffer comprises:
   a first P channel transistor connected between an external supply power and a first node;
   a second P channel transistor connected between said first node and an output terminal, with a gate of said second P channel transistor receiving an input voltage,
   a first N channel transistor connected between said output terminal and a second node, with a gate of said first N channel transistor being connected to a gate of said first P channel transistor;
   a second N channel transistor connected between a ground terminal and said second node;
   a third P channel transistor connected between said first node and a third node which is connected to each gate of said first P channel transistor and said second N channel transistor, with a gate of said third P channel transistor receiving a reference voltage, and
   a third N channel transistor connected between said third node and said second node, with a gate of said third N channel transistor being connected to said gate of said third P channel transistor.

3. The data input buffer as claimed in claim 1, wherein said first determination signal is LVTTL or TTL standards.

4. A data input buffer comprising:
   a switching circuit controlled by first and second determination signals; and
   a buffering circuit selectively operated as a SSTL buffer or a LVTTL buffer in accordance with operation of said switching circuit, wherein said second determination signal is a signal standard, a logic Low and a logic High level of the input and output signals thereof being determined by a relative potential using the difference between a reference voltage having a constant potential level and the signal.

5. The data input buffer as claimed in claim 1, wherein said second determination signal is SSTL, CTT or HSTL signal standards.

6. A data input buffer comprising:
   a switching circuit controlled by first and second determination signals; and
   a buffering circuit selectively operated as a SSTL buffer or a LVTTL buffer in accordance with operation of said switching circuit, wherein said LVTTL buffer is a a a CMOS inverter circuit.

7. A data input buffer comprising:
   a switching circuit controlled by first and second determination signals; and
   a buffering circuit selectively operated as a SSTL buffer or a LVTTL buffer in accordance with operation of said switching circuit, wherein said STTL buffer is a differential amplifier having a current mirror structure.

8. A data input buffer comprising:
   a switching circuit controlled by first and second determination signals; and
   a buffering circuit selectively operated as a SSTL buffer or a LVTTL buffer in accordance with operation of said switching circuit, wherein said LVTTL buffer comprises:
   a first P channel transistor connected between an external supply power and a first node, wherein a gate of said first P channel transistor is connected to a ground terminal;
   a second P channel transistor connected between said first node and an output terminal, wherein a gate of said second P channel transistor receives an input voltage,
   a first N channel transistor connected between said output terminal and a second node, wherein a gate of said first N channel transistor receives said input voltage, and
   a second N channel transistor connected between said second node and said ground terminal, wherein a gate of said second N channel transistor is connected to said external supply power.

9. The data input buffer as claimed in claim 1, wherein said first switching circuit comprises P channel and N channel transistors connected between said external supply power and said node, wherein gates of said P channel and N channel transistors receive said first determination signal.

10. The data input buffer as claimed in claim 1, wherein said second switching circuit comprises P channel and N channel transistors connected between said node and said ground terminal, wherein gates of said P channel and N channel transistors receive said second determination signal.

* * * * *